United States Patent
Hahn

[11] Patent Number: 5,985,734
[45] Date of Patent: Nov. 16, 1999

[54] METHOD FOR FABRICATING A SEMICONDUCTOR DEVICE

[75] Inventor: Dae Hee Hahn, Kyoungki-do, Rep. of Korea

[73] Assignee: Hyundai Electronics Industries Co., Ltd., Kyoungki-do, Rep. of Korea

[21] Appl. No.: 08/979,235

[22] Filed: Nov. 26, 1997

[30] Foreign Application Priority Data

Dec. 31, 1996 [KR] Rep. of Korea ............. 96-80242

[51] Int. Cl.⁶ ................................. H01L 21/76
[52] U.S. Cl. ............. 438/425; 438/439; 438/362; 438/297; 438/221
[58] Field of Search ..................... 438/425, 424, 438/439, 362, 297, 221, 225

[56] References Cited

U.S. PATENT DOCUMENTS

| | | | |
|---|---|---|---|
| 4,665,010 | 5/1987 | Herd et al. | 438/424 |
| 4,892,614 | 1/1990 | Chapman et al. | 438/439 |
| 5,192,706 | 3/1993 | Rodder | 438/424 |
| 5,202,286 | 4/1993 | Nakatani | 438/424 |
| 5,498,566 | 3/1996 | Lee | 438/425 |
| 5,696,022 | 12/1997 | Jang | 438/439 |
| 5,700,733 | 12/1997 | Manning | 438/439 |
| 5,763,309 | 6/1998 | Chang | 438/425 |
| 5,807,784 | 9/1998 | Kim | 438/425 |
| 5,846,596 | 12/1998 | Shim et al. | 438/439 |
| 5,849,625 | 12/1998 | Hsue et al. | 438/424 |
| 5,858,830 | 1/1999 | Yoo et al. | 438/425 |
| 5,877,066 | 3/1999 | Stolmeijer et al. | 438/424 |

OTHER PUBLICATIONS

Stanley Wolf Silicon Processing for the VLSI Era vol. 2 Lattice Press pp. 45 and 568, 1990.

*Primary Examiner*—Charles Bowers
*Assistant Examiner*—David S Blum
*Attorney, Agent, or Firm*—Gary M. Nath; Gregory B. Kang; Nath & Associates

[57] ABSTRACT

A semiconductor device is disclosed, together with a fabricating method therefor. The semiconductor device has an etch barrier structure, made with SiN or SiON, which is formed on an element-isolating region alongside an active region. Although there is an alignment error which causes the element-isolating region to be exposed, the etch barrier structure protects the element-isolating region from being etched when carrying out the etching processes for contact holes in a semiconductor memory cell. Thus, while preventing the deterioration of element-isolation properties, the etch barrier structure can affords a larger allowable alignment error in the etching processes for contact holes, so it is possible to make a small active region and thus, highly integrate semiconductor devices.

10 Claims, 4 Drawing Sheets

METHOD FOR FABRICATING A SEMICONDUCTOR DEVICE

BACKGROUND OF THE INVENTION

1. Field of the Invention

The present invention relates, in general, to a semiconductor device and a method for fabricating the same and, more particularly, to an etch barrier structure which prevents the deterioration of element-isolation properties as well as affords a larger allowable alignment error in the etching processes for contact holes, thereby achieving the high integration of semiconductor devices.

2. Description of the Prior Art

Much of the advance in the high integration of semiconductor devices is dependent on the size of memory cells, which is, in turn, greatly determined by the design rule. That is, if the design rule is more strictly applied, the memory cells are made smaller in size, which allows a higher integration of semiconductor devices. Also, the memory capacity increases with the high integration of semiconductor devices. However, the high integration also give an increase to the size of memory chips.

It is, therefore, requisite for the improvement in the productivity and throughput of semiconductor device that the memory chip should be reduced in size by designing memory cells as small in size as possible under the same design rule.

The high integration of semiconductor devices is based on the progress which has been made in many techniques for semiconductor devices. Particularly, brilliant development has been achieved in lithography. Lithography, which plays a pivotal role in the high integration of semiconductor devices, is divided into a formation technique of fine patterns and an alignment technique of functional layers in a semiconductor device structure.

Up to now, the formation technique has been greatly advanced but not equally with the alignment technique. Thus, the limitation of this technique is a limiting factor to the reduction of the size of memory cells.

A self-alignment concept was suggested to overcome this limitation but is difficult to put into practice.

In a memory cell of a semiconductor device, a contact must be formed in an active region of a semiconductor substrate. For example, in each memory cell of DRAM, a contact hole is formed to connect a bit line and an electrode of a capacitor with an active region of a semiconductor substrate.

In this regard, a description will be given of an example in that the size of memory cells is increased owing to the limitation of the alignment technique in a conventional semiconductor device, in connection with some drawings, below.

Referring to FIGS. 1 and 2, there are, respectively, cross-sectionally and longitudinally shown, a memory cell of DRAM.

In order to fabricate the memory cell, first, a field oxide 3 is formed on a semiconductor substrate 1, to separate semiconductor elements, followed by the formation of a transistor structure in an active region, as shown in the figures.

Then, a first interlayer insulating film made of silicon oxide is formed between two word lines 5 over the active region and selectively etched to form a first contact hole 9.

Thereafter, a first conductive layer (not shown) is deposited over the first interlayer insulating film 7 to fill the first contact hole 9 and selectively patterned to form a bit line 11.

Over the resulting structure including the bit line 11 and the first interlayer insulating film 7 is deposited a blanket of a second interlayer insulating film 12 which is, then, selectively opened to form a second contact hole 13.

Subsequently, a second conductive layer (not shown) is constructed over the entire surface of both the second contact hole 13 and the second interlayer insulating film 12 so as to fully fill the second contact hole 13, followed by the patterning of the second conductive layer, to give a storage electrode 15.

Finally, after a dielectric film (not shown) is provided for the storage electrode 15, a plate electrode 17 is formed over the dielectric film, to produce a memory cell of DRAM.

This conventional fabricating technique have a significant problems. There inevitably occurs an alignment error when the lithography process for forming the first contact hole is carried out. If the alignment error is so large that it is directed to the word line, when the interlayer insulating film is etched to form the first contact hole, the field oxide is etched at its edge, too, and thus, the element isolation becomes poor. This is attributed to the fact that the interlayer insulating film and the field oxide are silicon oxides which are identical in etch selection ratio.

On the other hand, if the alignment error widely occurs in a perpendicular direction to the word line, a shortage occurs between the word line and the bit line. This shortage can be overcome by recruiting an insulating film spacer into the side wall of the word line; however, in order to prevent the field oxide from being etched at its edge, the active region must be designed to have a wide width in the direction of the word line, leading to an increase in the size of cell. Thus, such an alignment error is a great impediment in reducing the size of memory cell.

Similarly, there occurs a problem upon the formation of the second contact hole. For example, if a large alignment error occurs in a perpendicular direction to the word line, the field oxide is etched at its edge and thus, the active region must be designed to be sufficiently large.

Consequently, the conventional technique has a great difficulty in highly integrating semiconductor devices.

SUMMARY OF THE INVENTION

Therefore, it is an object of the present invention to overcome the above problems encountered in prior arts and to provide a semiconductor device which is suitable for high integration.

It is another object of the present invention to provide a semiconductor device which has a structure in which an element-isolating region is not etched in the etching process for forming contact holes in a memory cell although there is an alignment error.

It is a further object of the present invention to provide a method for fabricating such a semiconductor device.

In accordance with an aspect of the present invention, there is provided a semiconductor device, comprising: a semiconductor substrate; an active region formed in the semiconductor substrate; an element-isolating region with a step being between said active region in the semiconductor substrate; an etch barrier structure formed on said element-isolating region alongside said active region; a word line formed on said active region; and a bit line which is insulated from said word line but electrically connected to said active region.

In accordance with another aspect of the present invention, there is provided a method for fabricating a semiconductor device, comprising the steps of: providing a semiconductor substrate; forming an element-isolating film for defining an active region and an element-isolating region in the semiconductor substrate with a step being said active region and an element-isolating region; forming an etch barrier structure on said element-isolating film alongside said active region; forming a word line over said active region; and forming a bit line over said active region, which is insulated from said word line but electrically connected to said active region.

In accordance with a further aspect of the present invention, there is provided a method for fabricating a semiconductor device, comprising the steps of: providing a semiconductor substrate; forming an active region and a trench in the semiconductor substrate; forming an element-isolating film in said trench to the degree that the element-isolating film has a step to said active region; forming an etch barrier structure on said element-isolating film alongside said active region; forming a word line over said active region; and forming a bit line over said active region, which is insulated from said word line but electrically connected to said active region.

BRIEF DESCRIPTION OF THE DRAWINGS

Other objects and aspects of the invention will become apparent from the following description of embodiments with reference to the accompanying drawings in which.

DETAILED DESCRIPTION OF PREFERRED EMBODIMENTS

Figure 1:
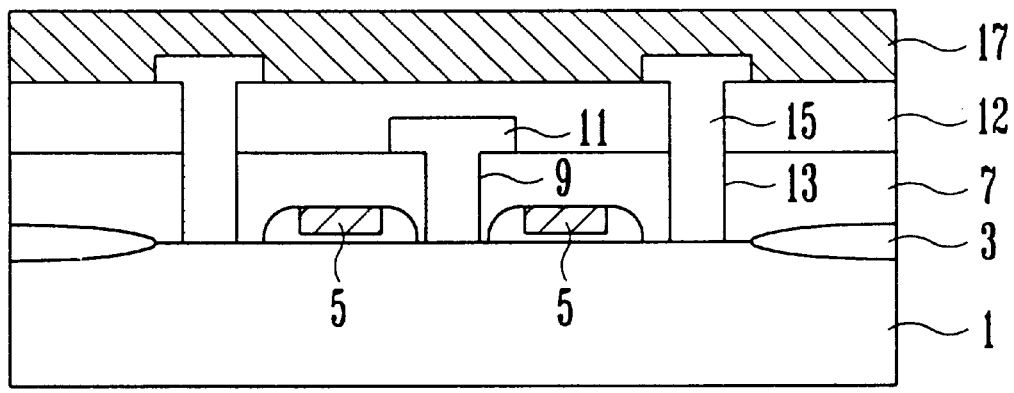
FIGS. 1 and 2 are cross sectional views illustrating a conventional semiconductor device and a fabricating method of the same.
Figure 2:
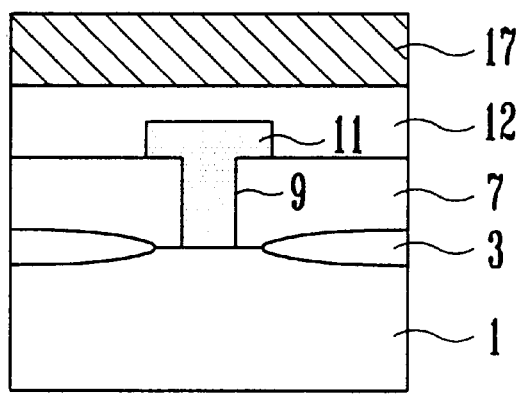

The application of the preferred embodiments of the present invention is best understood with reference to the accompanying drawings, wherein like reference numerals are used for like and corresponding parts, respectively.

Referring to FIGS. 3 through 7, there is illustrated a method for fabricating a semiconductor device, according to an embodiment of the present invention.

Figure 3:
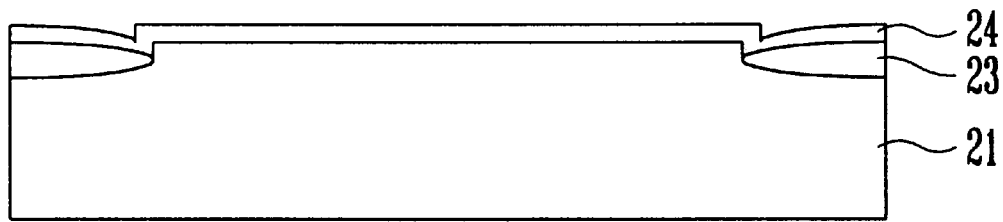
FIGS. 3 through 7 are cross sectional views illustrating a semiconductor device and a fabricating method of the same, according to an embodiment of the present invention.

The method starts by carrying out a thermal oxidation process to form a field oxide 23 on a semiconductor substrate 21, as shown in FIG. 3. This field oxide 23 is positioned below the surface of the semiconductor substrate 21 by etching out the field oxide 23 at a certain thickness, so there is formed a step at the boundary between the field oxide 23 and the active region. Then, a SiN or SiON thin film 24 which will serve as an etch barrier later, is deposited uniformly all over the surfaces of the field oxide 23 and the semiconductor substrate 21.

Figure 4:
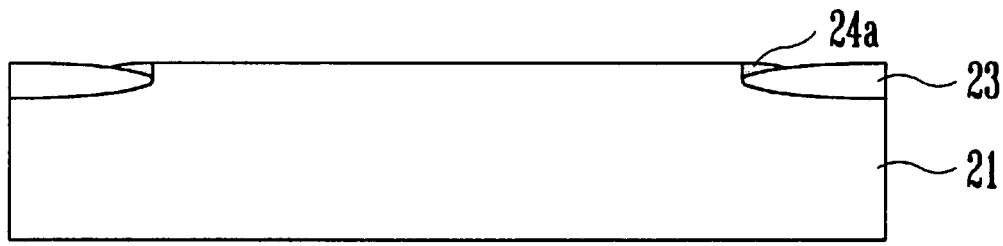

FIG. 4 is a cross section after the etch barrier 24 is anisotropically etched to give an etch barrier structure 24a. The etch barrier structure 24a is formed at the boundary between the element-isolating region and the active region; that is, on the field oxide 23 and at the side wall of the active region of the semiconductor substrate 21.

Optionally, prior to the formation of the etch barrier 24, a silicon oxide may be formed as a buffer to prevent the growth of the stress which may be generated between the etch barrier structure 24a and the semiconductor substrate 21. This buffer also plays a role of protecting the semiconductor substrate 21 from damage upon the formation of the etch barrier structure 24a.

Figure 5:
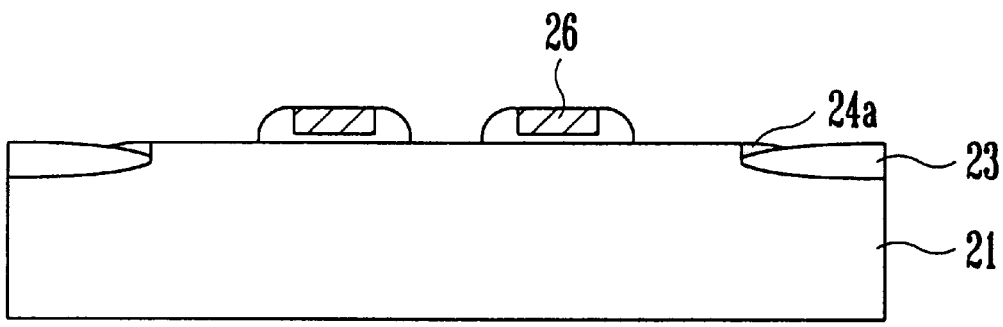

Then, as shown in FIG. 5, two word lines 26 are formed on the active region of the semiconductor substrate 21. An insulating film (not shown) is positioned beneath and alongside each of the word lines 26.

Figure 6:
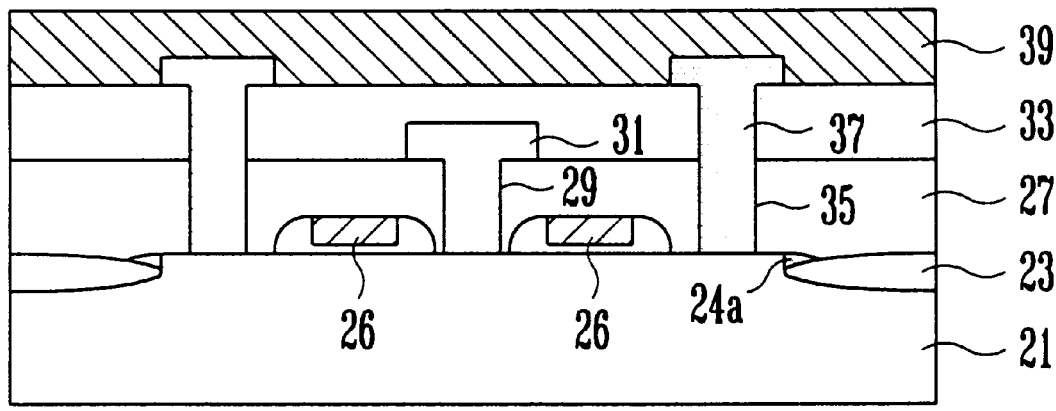
Figure 7:
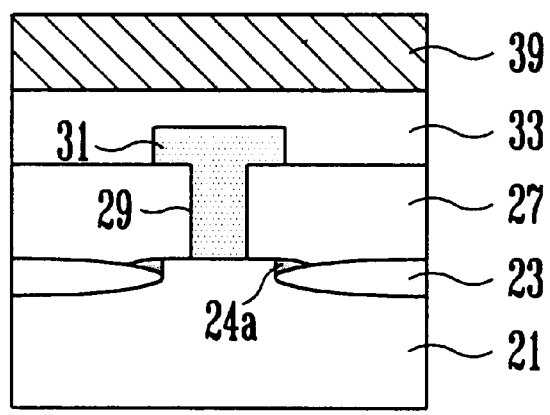

FIGS. 6 and 7 are cross-sectional or longitudinal views, respectively, showing a finished memory cell.

To this end, a first interlayer insulating film 27 for planarization is formed over the resulting structure of FIG. 5.

Then, this first insulating film 27 is selectively removed by an etch process using a bit line mask (not shown), to form a first contact hole 29 through which the semiconductor substrate 21 is exposed.

A first conductive layer (not shown) is deposited entirely over the first insulating film 27 to the degree that it fully fills the first contact hole 29 and, subjected to selective etch, to produce a bit line 31.

After a blanket of a second interlayer insulating film 33 is deposited over the resulting structure, an etch process is carried out to sequentially open the second interlayer insulating film 33 and the first interlayer insulating film 27 at predetermined regions by use of a storage electrode contact mask (not shown), so as to produce second contact holes 35 through which the semiconductor substrate 21 is exposed.

Again, a second conductive layer (not shown) is deposited entirely over the second insulating film 33 and the second contact hole 35 to the degree that it fully fills the second contact holes 35 and then, selectively removed, to produce storage electrodes 37.

Subsequently, a dielectric film (not shown) is formed at a predetermined thickness over each of the storage electrodes 37 and a plate electrode 39 is formed over the resulting structure to bring the memory cell to completion.

Figure 8:
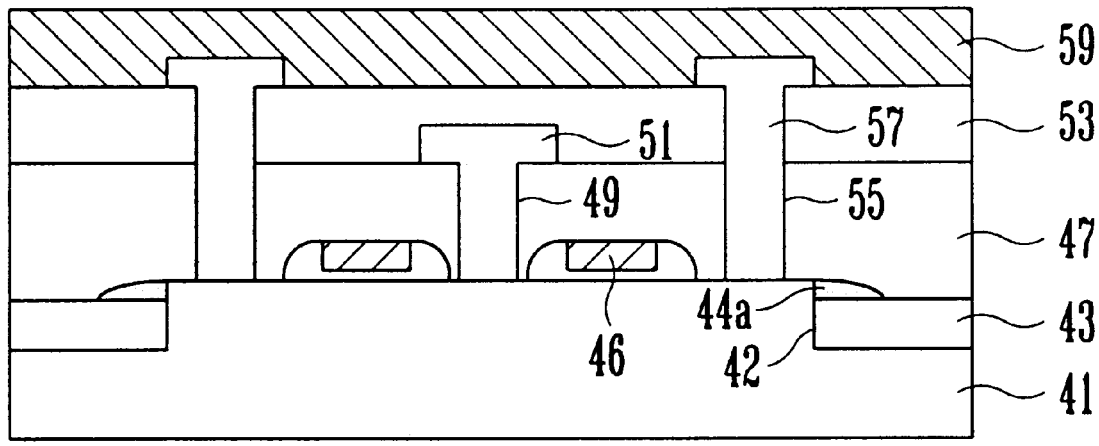
FIGS. 8 and 9 are cross sectional views illustrating a semiconductor device and a fabricating method of the same, according to another embodiment of the present invention.
Figure 9:
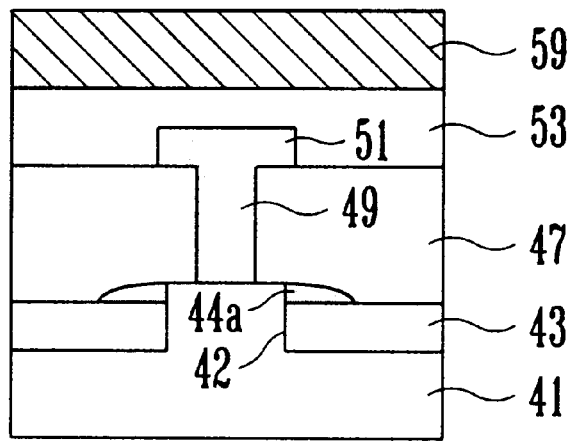

With reference to FIGS. 8 and 9, there is illustrated a method for fabricating a semiconductor device, according to another embodiment of the present invention.

As shown in these cross sectional and longitudinal views of FIGS. 8 and 9, a trench is adopted. That is, instead of directly forming the field oxide on the semiconductor substrate as in FIG. 3, a trench 42 is first formed at a certain depth in a semiconductor substrate 41 and then, filled with a field oxide 43, in this embodiment. At this time, the trench type field oxide 43 should be placed below the surface of the semiconductor substrate 41 so as to form a step therebetween.

After this, the subsequent processes are carried out in the same manner as illustrated in FIGS. 4 through 7.

That is, in the first place, a SiN or SiON thin film which will serve as an etch barrier later, is deposited uniformly all over the surfaces of both the field oxide 43 and the semiconductor substrate 41.

Then, the etch barrier is anisotropically etched to give an etch barrier structure 44a. That is, the etch barrier structure is positioned on the field oxide 43 alongside the active region of the semiconductor substrate 41.

As in the first embodiment, prior to the formation of the etch barrier, a silicon oxide may optionally be formed as a buffer to prevent the growth of the stress which may be generated between the etch barrier structure 44a and the semiconductor substrate 41.

Subsequently, two word lines 46 are formed on the active region of the semiconductor substrate 41. An insulating film (not shown) is positioned beneath and alongside each of the word lines 46.

The resulting structure is covered with a first interlayer insulating film 47 for planarization.

After planarization, this first insulating film 47 is selectively etched by using a bit line mask (not shown), to form a first contact hole 49 through which the semiconductor substrate 41 is exposed.

A first conductive layer (not shown) is deposited on the whole surface of the first insulating film 47 to the degree that it fully fills the first contact hole 49, followed by the selective etch of the first conductive layer, to produce a bit line 51.

After a blanket of a second interlayer insulating film 53 is deposited over the resulting structure, an etch process is carried out to sequentially open the second interlayer insulating film 53 and the first interlayer insulating film 47 at predetermined regions by use of a storage electrode contact mask (not shown), so as to produce second contact holes 55 through which the semiconductor substrate 41 is exposed.

Again, a second conductive layer (not shown) is deposited entirely over the second insulating film 53 to the degree that it fully fills the second contact holes 55 and then, selectively removed, to produce storage electrodes 55.

Thereafter, a dielectric film (not shown) is formed at a predetermined thickness over each of the storage electrodes 57 and a plate electrode 59 is formed over the resulting structure to bring a memory cell to completion.

As described hereinbefore, the present invention is characterized in that an etch barrier structure is formed on an element-isolating region alongside the active region. Although there is an alignment error, the etch barrier structure protects the field oxide from being etched when carrying out photo-etching processes for the first and the second contact holes. Thus, while preventing the deterioration of element-isolation properties, which results from the field oxide's being etched, the etch barrier structure according to the present invention affords a larger allowable alignment error in the photo-etching processes for the first and the second contact holes, so it is possible to make a small active region.

Consequently, the present invention can give a great contribution to the high integration of semiconductor devices.

The present invention has been described in an illustrative manner, and it is to be understood the terminology used is intended to be in the nature of description rather than of limitation.

Many modifications and variations of the present invention are possible in light of the above teachings. Therefore, it is to be understood that within the scope of the appended claims, the invention may be practiced otherwise than as specifically described.

What is claimed is:

1. A method for fabricating a semiconductor device, comprising the steps of:
    providing a semiconductor substrate;
    forming a field oxide on said semiconductor substrate;
    selectively removing a portion of the field oxide in such a way that it has a lower level from an active region;
    forming an element-isolating film for defining said active region and an element-isolating region in the semiconductor substrate, wherein said element-isolating region is lower than said active region;
    forming an etch barrier film all over the surfaces of the semiconductor substrate and said element-isolating region;
    anisotropically etching the etch barrier film, thereby forming an etch barrier structure on said element-isolating film and alongside said active region to prevent the etching of said element-isolating film by an alignment error occurring in the etching process for forming a contact hole, wherein said etch barrier structure is provided at the side wall of the active region of the semiconductor substrate;
    forming a word line over said active region of said semiconductor substrate; and
    forming a bit line over said active region of said semiconductor substrate, which is insulated from said word line but electrically connected to said active region.

2. A method in accordance with claim 1, wherein said element-isolating region is constructed by forming a trench in said semiconductor substrate and filling the trench with a field oxide in such a way that it has a step to said active region.

3. A method in accordance with claim 1, wherein said etch barrier structure is made with a silicon nitride.

4. A method in accordance with claim 1, wherein said etch barrier structure is made with a silicon oxynitride.

5. A method in accordance with claim 1, further comprising the step of forming a silicon oxide over the surface of said semiconductor substrate and said element-isolating region, prior to the formation of said etch barrier structure.

6. A method for fabricating a semiconductor device, comprising the steps of:
    providing a semiconductor substrate;
    forming a trench for defining an active region and an element-isolating region in the semiconductor substrate;
    forming an element-isolating film in said trench, wherein said element-isolating film has a lower level than said active region;
    forming an etch barrier film all over the surfaces of the semiconductor substrate and said element-isolating region;
    anisotropically etching the etch barrier film, thereby forming an etch barrier structure on said element isolating film alongside said active region to prevent the etching of said element-isolating film due to an alignment error occurring in the etching process for forming a contact hole, wherein said etch barrier structure is provided at the side wall of the active region of the semiconductor substrate;
    forming a word line over said active region of said semiconductor substrate; and
    forming a bit line over said active region of said semiconductor substrate, which is insulated from said word line but electrically connected to said active region.

7. A method in accordance with claim 6, wherein said etch barrier structure is made with a silicon nitride.

8. A method in accordance with claim 6, wherein said etch barrier structure is made with a silicon oxynitride.

9. A method in accordance with claim 6, further comprising the step of forming a silicon oxide over the surface of said semiconductor substrate and said element-isolating region, prior to the formation of said etch barrier structure.

10. A method for fabricating a semiconductor device, comprising the steps of:
    providing a semiconductor substrate;
    forming an element-isolating film for defining an active region and an element-isolating region in the semiconductor substrate, wherein said element-isolating region has a lower level than said active region;

forming an etch barrier film all over the surfaces of the semiconductor substrate and said element-isolating region;

anisotropically etching the etch barrier film, thereby forming an etch barrier structure on said element isolating film and alongside said active region to prevent the etching of said element-isolating film due to an alignment error occurring in the etching process for forming a contact hole, wherein said etch barrier structure is provided at the side wall of the active region of the semiconductor substrate;

forming a gate oxide film and a word line on said active region of said semiconductor substrate;

forming an interlayer insulating film over an entire surface of said resulting structure;

forming a contact hole in said interlayer insulating film;

forming a bit line over said active region of said semiconductor substrate through said contact hole, which is insulated from said word line but electrically connected to said active region.

* * * * *